US012615812B2

(12) United States Patent
Xie et al.

(10) Patent No.: US 12,615,812 B2
(45) Date of Patent: Apr. 28, 2026

(54) STACKED FIELD-EFFECT TRANSISTORS

(71) Applicant: International Business Machines Corporation, Armonk, NY (US)

(72) Inventors: Ruilong Xie, Niskayuna, NY (US); Su Chen Fan, Cohoes, NY (US); Julien Frougier, Albany, NY (US); Maruf Amin Bhuiyan, Albany, NY (US); Pouya Hashemi, Purchase, NY (US); Takashi Ando, Eastchester, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 869 days.

(21) Appl. No.: 17/651,919

(22) Filed: Feb. 22, 2022

(65) Prior Publication Data

US 2023/0268388 A1 Aug. 24, 2023

(51) Int. Cl.
H10D 62/10 (2025.01)
H10D 30/01 (2025.01)
(Continued)

(52) U.S. Cl.
CPC ......... H10D 62/118 (2025.01); H10D 30/031 (2025.01); H10D 30/6735 (2025.01);
(Continued)

(58) Field of Classification Search
CPC .. H10D 62/118; H10D 62/115; H10D 62/121; H10D 62/124; H10D 62/151;
(Continued)

(56) References Cited

U.S. PATENT DOCUMENTS

| | | |
|---|---|---|
| 8,841,711 B1 | 9/2014 | Cai et al. |
| 9,224,811 B2 | 12/2015 | Cheng et al. |

(Continued)

FOREIGN PATENT DOCUMENTS

| | | |
|---|---|---|
| EP | 2519975 B1 | 5/2018 |
| EP | 4089722 A1 | 11/2022 |
| WO | 2023/161760 A1 | 8/2023 |

OTHER PUBLICATIONS

Notification of Transmittal of the International Search Report and the Written Opinion of the International Searching Authority, or the Declaration, International Application No. PCT/IB2023/051261, May 12, 2023, 12 pgs.

(Continued)

*Primary Examiner* — Dao H Nguyen
(74) *Attorney, Agent, or Firm* — Seed Intellectual Property Law Group LLP

(57) ABSTRACT

Provided is a stacked field-effect transistor (FET). The stacked FET comprises a top active region. The width of the top of the top active region is smaller than the width of bottom of the top active region. The stacked FET further comprises a top contact in direct contact with a top surface of the top active region. The stacked FET further comprises a bottom active region located substantially below the top active region. The stacked FET further comprises a bottom contact in direct contact with a top surface of the bottom active region. The bottom contact is wider at a top end than at a bottom end.

9 Claims, 18 Drawing Sheets

(51) Int. Cl.
*H10D 30/67* (2025.01)
*H10D 84/83* (2025.01)

(52) U.S. Cl.
CPC ....... *H10D 30/6757* (2025.01); *H10D 62/115* (2025.01); *H10D 84/83* (2025.01)

(58) Field of Classification Search
CPC ............. H10D 30/031; H10D 30/6735; H10D 30/6757; H10D 30/43; H10D 30/014; H10D 84/83; H10D 84/85; H10D 84/0188; H10D 84/0184; H10D 84/0167; H10D 84/017; H10D 84/0186; H10D 84/038; H10D 84/8311; H10D 64/017; H10D 64/254
See application file for complete search history.

(56) References Cited

U.S. PATENT DOCUMENTS

| | | | |
|---|---|---|---|
| 9,659,963 | B2 | 5/2017 | Cheng et al. |
| 9,698,245 | B2 | 7/2017 | Cheng et al. |
| 9,837,414 | B1 | 12/2017 | Balakrishnan et al. |
| 9,997,598 | B2 | 6/2018 | Smith et al. |
| 10,026,824 | B1 | 7/2018 | Chanemougame et al. |
| 10,164,104 | B2 | 12/2018 | Zhang et al. |
| 10,192,819 | B1 | 1/2019 | Chanemougame et al. |
| 10,192,867 | B1 | 1/2019 | Frougier et al. |
| 10,283,621 | B2 | 5/2019 | Xie et al. |
| 10,461,186 | B1 | 10/2019 | Zhang et al. |
| 10,658,462 | B2 | 5/2020 | Lee et al. |
| 10,679,894 | B2 | 6/2020 | Frougier et al. |
| 10,714,391 | B2 | 7/2020 | Smith et al. |
| 10,748,994 | B2 | 8/2020 | Reznicek et al. |
| 10,811,415 | B2 | 10/2020 | Sengupta et al. |
| 10,833,078 | B2 | 11/2020 | Smith et al. |
| 10,879,352 | B2 | 12/2020 | Zhang et al. |
| 11,069,684 | B1* | 7/2021 | Xie ................... H01L 21/02603 |
| 11,121,044 | B2 | 9/2021 | Cheng et al. |
| 11,121,236 | B2 | 9/2021 | Wu et al. |
| 11,158,544 | B2 | 10/2021 | Cheng et al. |
| 11,164,793 | B2* | 11/2021 | Xie ..................... H10D 84/038 |
| 11,239,232 | B2 | 2/2022 | Lilak et al. |
| 11,367,722 | B2 | 6/2022 | Lilak et al. |
| 11,502,167 | B2 | 11/2022 | Hong et al. |
| 12,040,400 | B2* | 7/2024 | Chiang ................ H10D 62/118 |
| 12,356,665 | B2 | 7/2025 | Yun et al. |
| 2020/0020587 | A1 | 1/2020 | Cheng et al. |
| 2020/0203343 | A1* | 6/2020 | Zhu ................... H10D 84/0167 |
| 2021/0028169 | A1 | 1/2021 | Smith et al. |
| 2021/0098464 | A1 | 4/2021 | Huang |
| 2021/0296184 | A1 | 9/2021 | Xie et al. |
| 2021/0305246 | A1 | 9/2021 | Huang et al. |
| 2021/0313231 | A1 | 10/2021 | Thompson et al. |
| 2021/0407999 | A1 | 12/2021 | Huang et al. |
| 2022/0301936 | A1 | 9/2022 | Merchant et al. |
| 2022/0352181 | A1 | 11/2022 | Yang et al. |
| 2022/0367520 | A1 | 11/2022 | Hong et al. |
| 2022/0367658 | A1 | 11/2022 | Yim et al. |
| 2023/0051674 | A1* | 2/2023 | Wu .................... H10D 84/0149 |
| 2023/0086084 | A1 | 3/2023 | Yun et al. |
| 2023/0125316 | A1 | 4/2023 | Xie et al. |
| 2023/0178554 | A1* | 6/2023 | Chehab .............. H10D 84/0186 |
| | | | 257/351 |
| 2023/0178593 | A1 | 6/2023 | Yeh et al. |
| 2023/0307456 | A1 | 9/2023 | Lin et al. |
| 2023/0343823 | A1 | 10/2023 | Baek et al. |
| 2023/0402519 | A1* | 12/2023 | Anderson .......... H10D 84/0128 |
| 2024/0006244 | A1* | 1/2024 | Mochizuki ......... H10D 30/6735 |
| 2025/0006736 | A1 | 1/2025 | Senapati et al. |
| 2025/0048690 | A1* | 2/2025 | Chehab .................. H10D 88/01 |
| 2025/0133816 | A1* | 4/2025 | Xie ...................... H10D 84/038 |
| 2025/0203963 | A1* | 6/2025 | Bao .................... H10D 84/0188 |
| 2025/0204041 | A1* | 6/2025 | Bao ...................... H10D 84/851 |
| 2025/0239521 | A1* | 7/2025 | Reboh .................... H10D 88/01 |

OTHER PUBLICATIONS

International Searching Authority, "Invitation to Pay Additional Fees and Partial Search Report" Patent Cooperation Treaty, dated Aug. 12, 2024, 10 pages, International Application No. PCT/EP2024/064351.

International Searching Authority, "Notification of Transmittal of the International Search Report and the Written Opinion of the International Searching Authority, or Declaration," Patent Cooperation Treaty, Oct. 4, 2024, 20 p. International Application No. PCT/EP2024/064351.

Lacord, J. et al, "Comprehensive and Accurate Parasitic Capacitance Models for Two- and Three-Dimensional CMOS Device Structures," in IEEE Transactions on Electron Devices, vol. 59, No. 5, pp. 1332-1344, May 2012, doi: 10.1109/TED.2012.2187454.

Song, T, "Many-Tier Vertical GAAFET (V-FET) for Ultra-Miniaturized Standard Cell Designs Beyond 5 nm," in IEEE Access, vol. 8, pp. 149984-149998, 2020, doi: 10.1109/ACCESS.2020.3015596.

United States Non-Final Rejection dated Oct. 22, 2025, 36 pages, in U.S. Appl. No. 18/214,682.

* cited by examiner

100
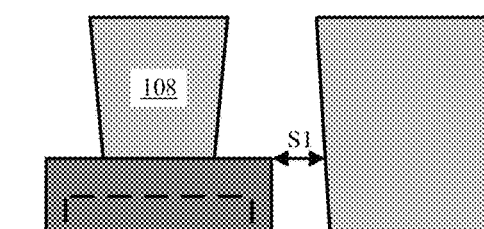
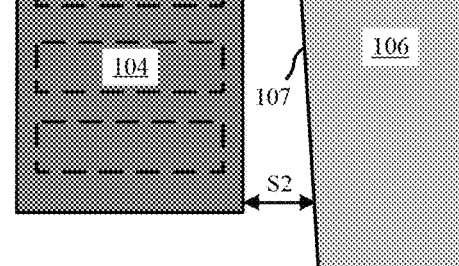
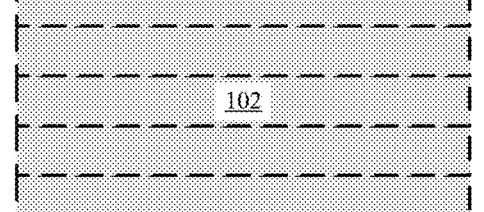
150
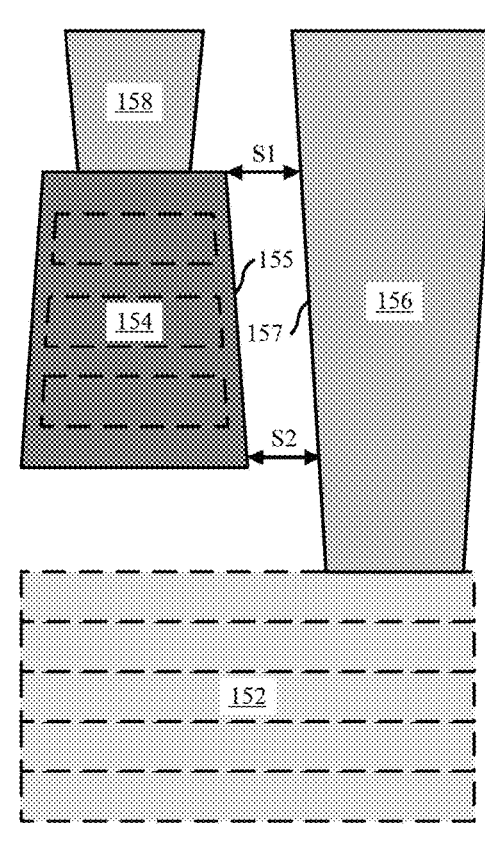
FIG. 1A                    FIG. 1B

200

START

Form an active region (RX) cut for a top device with a cavity.
202

Form a first dielectric liner in the cavity.
204

Form a second dielectric fill in the cavity.
206

Form a bottom contact by selectively etching the second dielectric fill to the first dielectric liner.
208

END

STACKED FIELD-EFFECT TRANSISTORS

BACKGROUND

The present invention relates in general to semiconductor fabrication methods and resulting structures. More specifically, the present invention relates to stacked field-effect transistors (FET) and methods of forming the same.

A stacked FET is a transistor architecture where the idea is to stack both n-type FET (nFET) and p-type FET (pFET) wires on each other. A stacked FET can stack one nFET on top of a pFET transistor, or one PFET on top of a nFET transistor, or one nFET over anther nFET, or one pFET over another PFET. Since a stacked FET stacks two devices on each other, the transistor provides benefits related to area.

SUMMARY

Embodiments of the present invention include fabrication methods and the corresponding structures. Some embodiments of the present disclosure include a stacked field-effect transistor (FET). The stacked FET comprises a top active region. The width of the top of the top active region is smaller than the width of bottom of the top active region. The stacked FET further comprises a top contact in direct contact with a top surface of the top active region. The stacked FET further comprises a bottom active region located substantially below the top active region. The stacked FET further comprises a bottom contact in direct contact with a top surface of the bottom active region. The bottom contact is wider at a top end than at a bottom end such that a distance between the bottom contact and the top active region is substantially identical from the bottom surface of the top active region to the top surface of the top active region.

Further embodiments of the present disclosure include a stacked FET comprising a bottom device and a top device. The top device is located above the bottom device. The stacked FET further comprises a filled trench next to the top device. The filled trench extends from a top surface of the bottom device past the top device to a point above the top surface of the top device. The filled trench runs through both the epitaxy region and the gate region of the stacked FET.

Additional embodiments of the present disclosure include a fabrication method. The fabrication method comprises forming a trench alongside a top device of a stacked FET. The trench extends through both a gate region and an epitaxy region of the stacked FET, and a bottom of the trench exposes a top portion of a bottom device of the stacked FET. The method further comprises forming a first dielectric liner in at least a portion of the trench. The portion of the trench with the dielectric liner includes that part of the trench that is in the epitaxy region of the stacked FET. The method further comprises forming a second dielectric fill in the trench. The method further comprises forming a bottom contact in the epitaxy region of the stacked FET by selectively etching the second dielectric fill.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

FIG. 1A is a schematic diagram illustrating an example stacked FET with a rectangular top active region, in accordance with embodiments of the present disclosure.

FIG. 1B is a schematic diagram illustrating an example stacked FET with a trapezoidal top active region, in accordance with embodiments of the present disclosure.

Figure 2:
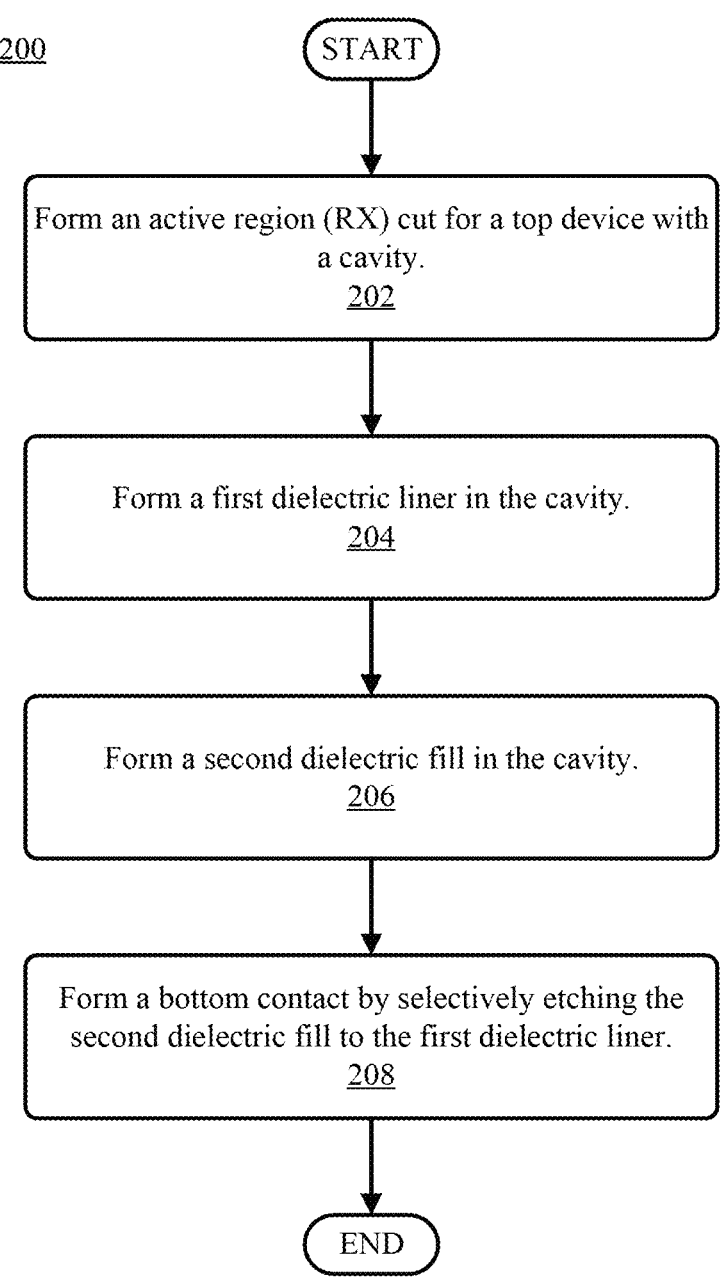
FIG. 2 illustrates a flowchart of an example method for forming a semiconductor component, in accordance with embodiments of the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the invention.

DETAILED DESCRIPTION

Embodiments of the present invention are generally directed to semiconductor fabrication methods and resulting structures, and more particularly to stacked field-effect transistors (FETs) and methods of making the same. While the present disclosure is not necessarily limited to such applications, various aspects of the disclosure may be appreciated through a discussion of various examples using this context.

Various embodiments of the present disclosure are described herein with reference to the related drawings, where like numbers refer to the same component. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

The terms "about," "substantially," "approximately," "slightly less than," and variations thereof, are intended to include the degree of error associated with measurement of the particular quantity based upon the equipment available at the time of filing the application. For example, "about" can include a range of ±8% or 5%, or 2% of a given value.

For purposes of the description hereinafter, when a first surface is referred to as being arranged "opposite" to a second surface, the first surface is different from the second surface, and the first surface is spaced apart from the second surface. For instances in which the surfaces are substantially planar, the first surface is substantially parallel to the second surface.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etch processes (either wet or dry), chemical-mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist.

To build the complex structures that make up a transistor and the many wires that connect the millions of transistors of a circuit, lithography and etch pattern transfer steps are repeated multiple times. Each pattern being printed on the wafer is aligned to the previously formed patterns and gradually the conductors, insulators and selectively doped regions are built up to form the final device.

Turning now to an overview of technologies that are more specifically relevant to aspects of the present disclosure, an integrated circuit (IC) is a set of electronic circuits on one small flat piece (or "chip") of semiconductor material. More specifically, large numbers of tiny transistors can be integrated into a small chip, and interconnects can be used to connect two or more circuit elements (such as transistors) on the chip together electrically. This results in circuits that are orders of magnitude smaller, faster, and less expensive than those constructed of discrete electronic components.

The field-effect transistor (FET) is a type of transistor that uses an electric field to control the flow of current in a semiconductor. FETs are devices with three terminals: a source, a gate, and a drain. FETs control the flow of current by the application of a voltage to the gate, which in turn alters the conductivity between the drain and source. More specifically, the FET controls the flow of electrons (or holes) from the source to drain by affecting the size and shape of a conductive channel created and influenced by voltage (or lack of voltage) applied across the gate and source terminals. (For simplicity, this discussion assumes that the body and source are connected.) This conductive channel is the stream through which electrons flow from source to drain.

FETs are also known as unipolar transistors since they involve single-carrier-type operation. In other words, a FET uses either electrons or holes as charge carriers in its operation, but not both. The source/drain of a FET is doped to produce either an n-type semiconductor (in which case the FET can be referred to as an NFET) or a p-type semiconductor (in which case the FET can be referred to as a PFET). When the voltage applied to the gate of the FET is larger than the threshold voltage, the charge carriers in the channel region of the FET are built up, which activates the FET (e.g., allowing current to flow between the source and the drain).

Many different types of field effect transistors exist. A gate-all-around (GAA) FET is a non-planar (3D) transistor designed such that the gate material surrounds the channel region on all sides. Accordingly, the contact between the gate and the channel is increased, which provides better electrical control over the channel. A GAAFET can be a PFET or an NFET. A gate-all-around n-type semiconductor may also be referred to herein as a GAA NFET. Similarly, a gate-all-around p-type semiconductor may also be referred to herein as a GAA PFET.

A complementary field-effect transistor (CFET) utilizes GAAFETs vertically stacked on top of one another to reduce the amount of space required to accommodate multiple transistors. In particular, in a CFET, GAAFETs of opposite polarity are vertically stacked on top of one another. For example, a GAA PFET can be vertically stacked on top of an GAA NFET, or a GAA NFET can be vertically stacked on top of a GAA PFET.

Once stacked, a pair including a GAA PFET and an GAA NFET can be functionally interconnected and utilized as a complementary metal-oxide-semiconductor (CMOS) cell. In a CMOS cell, complementary pairs of PFETs and NFETs are used for logic functions.

One benefit of stacked FET technologies/architectures (e.g., CFETs) is that stacking transistors can permit smaller scale devices. However, interconnecting stacked transistors and CMOS cells can become complicated and congested, which can lead to reliability issues and/or may require additional space to accommodate interconnection structures. For example, many current CFET technique have a larger bottom active region (RX) to provide additional room to the "sides" of the top RX. This allows the bottom contact to run alongside the top contact and the top RX (e.g., the top epitaxy region) such that the bottom and top contacts are both accessible from above the CFET.

However, this creates a couple issues that can significantly affect performance. First, the bottom contact can easily short to the top epitaxy. This is illustrated in FIG. 1A, which shows portions of a stacked FET 100. In particular, FIG. 1A shows a typical stacked FET stack having a bottom epitaxy 102 (also known as a bottom source/drain epi; e.g., including one or more nanosheets) and a top epitaxy 104 (also known as a top source/drain epi; e.g., including one or more nanosheets). The stacked FET 100 further includes a top contact 108 on the top epitaxy 104 and a bottom contact 106 on the bottom epitaxy 102. As shown in FIG. 1A, the top epitaxy 104 is generally rectangular in shape, but the bottom contact 106 is trapezoidal, with the top of the bottom contact 106 being wider than the bottom of the top contact, as illustrated by the slanted surface 107 of the bottom contact 106. As such, the bottom contact 106 is closer to the top epitaxy 104 at the top of the stacked FET 100 than at the bottom. In other words, the distance between the bottom contact 106 and the top epitaxy 104 at the top of the top epitaxy (S1) is smaller than the distance between them at the bottom of the top epitaxy (S2). This can create a situation where the bottom contact 106 shorts to the top epitaxy 104. Similarly, because the bottom contact 106 passes close to the top epitaxy 104, a high parasitic capacitance can form between the bottom contact 106 and the top epitaxy 104. This parasitic capacitance can reduce performance of the stacked FET 100.

In order to address these concerns, the bottom contact 106 is often spaced out further from the top epitaxy 104 to ensure a minimum gap in maintained between the bottom contact 106 and the top epitaxy 104 at the closest point. However, patterning for this minimum gap means that the bottom of the bottom contact 106 is set even further away from the bottom of the top epitaxy 104 to account for the sloped bottom contact. This results in a larger bottom epitaxy 102 and an increased overall size/area of the stacked FET 100, thereby reducing the CFET density of a chip.

Embodiments of the present disclosure may overcome these and other drawbacks of existing solutions by patterning the top epitaxy of a stacked transistor such that the side of the top epitaxy that faces the bottom contact is sloped away from the bottom contact. The slope of the top epitaxy may be substantially similar to the slope of the inner surface of the bottom contact. In other words, the surfaces of the top epitaxy and the bottom contact that face each other may run substantially parallel to each other. This ensures that the minimum gap between the bottom contact and the top epitaxy can be maintained along the entire surface, thereby reducing the distance that the bottom contact has to be offset from the top epitaxy, reducing the space between the top contact and the bottom contact, and increasing the density of the CFETs.

Embodiments of the present disclosure include one or more stacked FETs and methods of fabricating the same. Embodiments of the present disclosure may overcome these and other drawbacks of existing solutions by patterning the top epitaxy of a stacked transistor such that the side of the top epitaxy that faces the bottom contact is sloped away from the bottom contact. The slope of the top epitaxy may be substantially similar to the slope of the inner surface of the bottom contact. In other words, the surfaces of the top epitaxy and the bottom contact that face each other may run substantially parallel to each other. This ensures that the minimum gap between the bottom contact and the top epitaxy can be maintained along the entire surface, thereby reducing the distance that the bottom contact has to be offset from the top epitaxy, reducing the space between the top contact and the bottom contact, and increasing the density of the CFETs.

In a first embodiment of the present disclosure, this is achieved by simply patterning the top active channels (RX) with a gradually increasing width from top to bottom (e.g., a trapezoidal shape), such that the distance between the top source/drain epitaxy and the bottom contact at the top position is not smaller than distance between top source/drain epitaxy and bottom contact at the bottom position. While this may address the above concerns regarding shorting of the bottom contact and the creation of a parasitic capacitance, it is not necessarily a self-aligning approach and the width of the gap at the top is still determined by the lithography process. An example of the first embodiment is shown in FIG. 1B.

In a second embodiment of the present disclosure, the stacked FET device comprises a dielectric filled trench over the bottom device next to the top channels and the top source/drain epitaxy. The dielectric filled trench has a first dielectric liner along the sidewalls and a second dielectric fill as the core. A bottom source/drain contact can be formed by selectively etching the second dielectric core to the first dielectric liner through the dielectric filled trench. An electrically conductive material can then be deposited into the core such that the resulting semiconductor device includes the first dielectric liner between the bottom contact and the top RX. This process is self-aligning and results in a stacked FET device with consistent spacing between the bottom contact and the top RX. However, one drawback of this process is that the resulting device is a tri-gate device, as opposed to a GAAFET, with one of the sides not being covered by the gate, but instead being covered by the dielectric liner. FIGS. 4A-4H illustrate a process of fabricating an example of the second embodiment, with a completed stacked FET in accordance with the second embodiment being shown in FIG. 4H.

In a third embodiment of the present disclosure, the stacked FET device comprises a dielectric filled trench over the bottom device next to the top channels and the top source/drain epitaxy. The dielectric filled trench has a first dielectric liner along the sidewalls and a second dielectric fill as the core in the source/drain region. The dielectric filled trench only has second dielectric fill as the core in the gate region. In other words, there is no first dielectric liner in the gate region of the stacked FET device. A bottom source/drain contact can be formed by selectively etching the second dielectric core to the first dielectric liner through the dielectric filled trench. An electrically conductive material can then be deposited into the core such that the resulting semiconductor device includes the first dielectric liner between the bottom contact and the top RX in the source/drain region. This process is self-aligning and results in a stacked FET device with consistent spacing between the bottom contact and the top RX. FIGS. 5A-5D illustrate a process of fabricating an example of the third embodiment, starting from an intermediate state. The intermediate state of the third embodiment is also an intermediate state of the second embodiment. In particular, the intermediate state for the third embodiment is the state shown in FIG. 4E. A completed stacked FET in accordance with the third embodiment is shown in FIG. 5D.

Figure 6A:
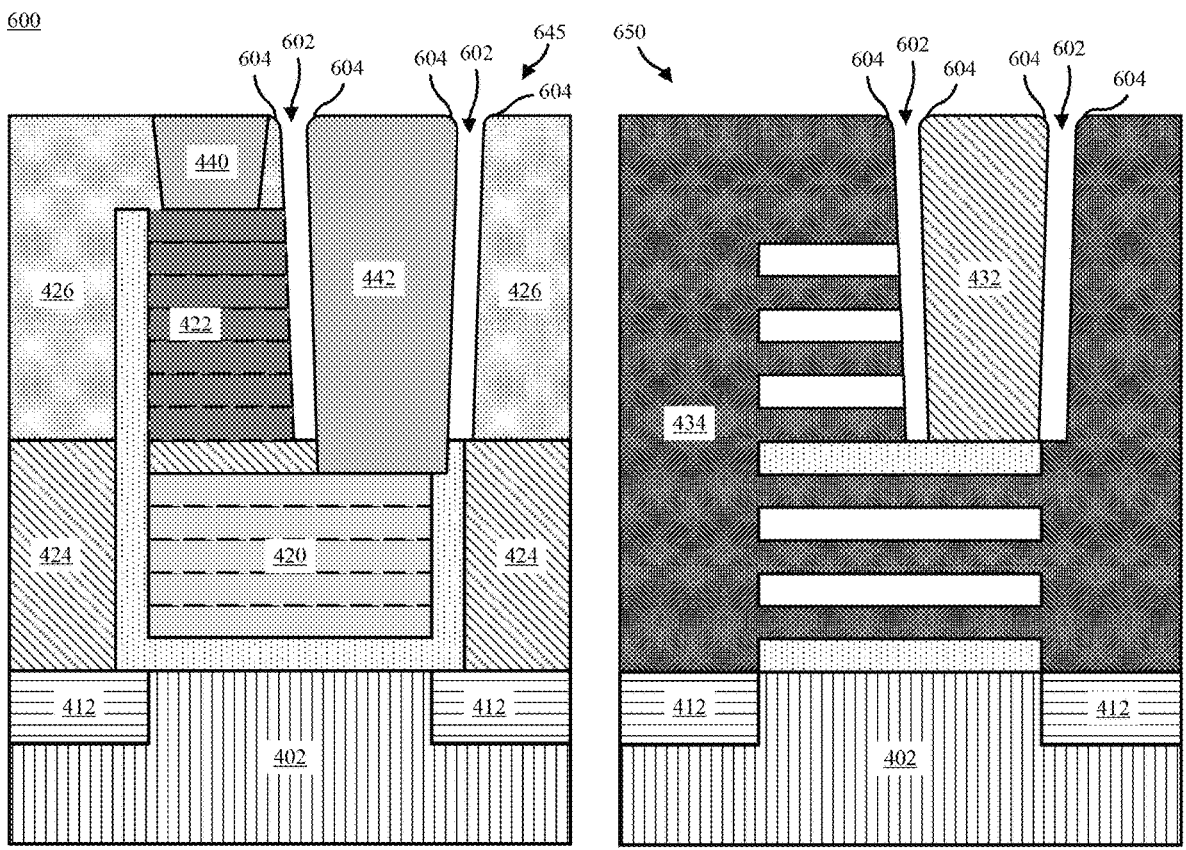
FIG. 6A illustrates a cross sectional view of an example of the semiconductor structure of FIG. 4H following the performance of additional fabrication operations, in accordance with embodiments of the present disclosure.
Figure 6B:
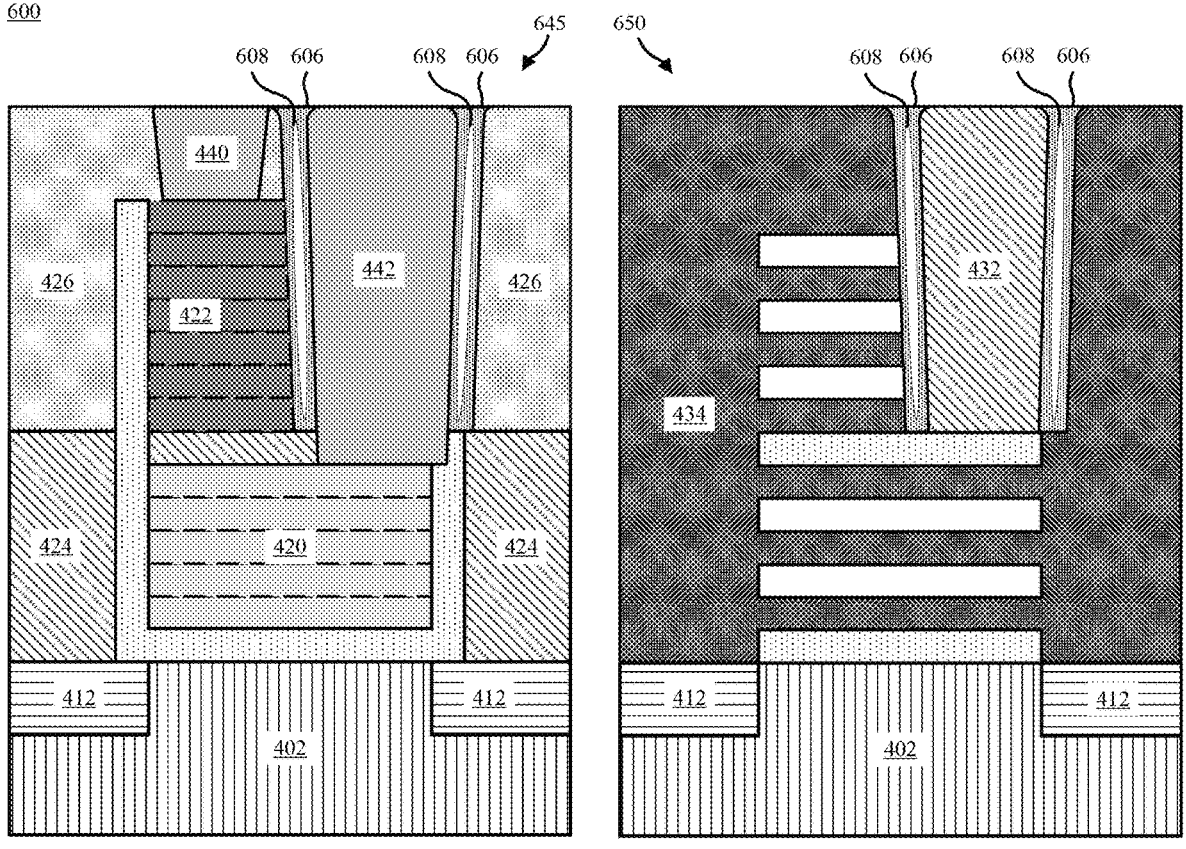
FIG. 6B illustrates a cross sectional view of an example of the semiconductor structure of FIG. 6A following the performance of additional fabrication operations, in accordance with embodiments of the present disclosure.

In a fourth embodiment of the present disclosure, the stacked FET device comprises a dielectric filled trench over the bottom device next to the top channels and the top source/drain epitaxy. The dielectric filled trench has a first dielectric liner along the sidewalls and a second dielectric fill as the core, as discussed above with regard to the second embodiment. Unlike the second embodiments, however, an airgap exists in the first dielectric liner. A bottom source/drain contact can be formed by selectively etching the second dielectric core to the first dielectric liner through the dielectric filled trench. An electrically conductive material can then be deposited into the core such that the resulting semiconductor device includes the first dielectric liner between the bottom contact and the top RX. This process is self-aligning and results in a stacked FET device with consistent spacing between the bottom contact and the top RX. FIGS. 6A-6B illustrate a process of fabricating an example of the third embodiment, starting from an intermediate state. The intermediate state is the completed state of the second embodiment shown in FIG. 4H. A completed stacked FET in accordance with the fourth embodiment is shown in FIG. 6B.

Figure 7:
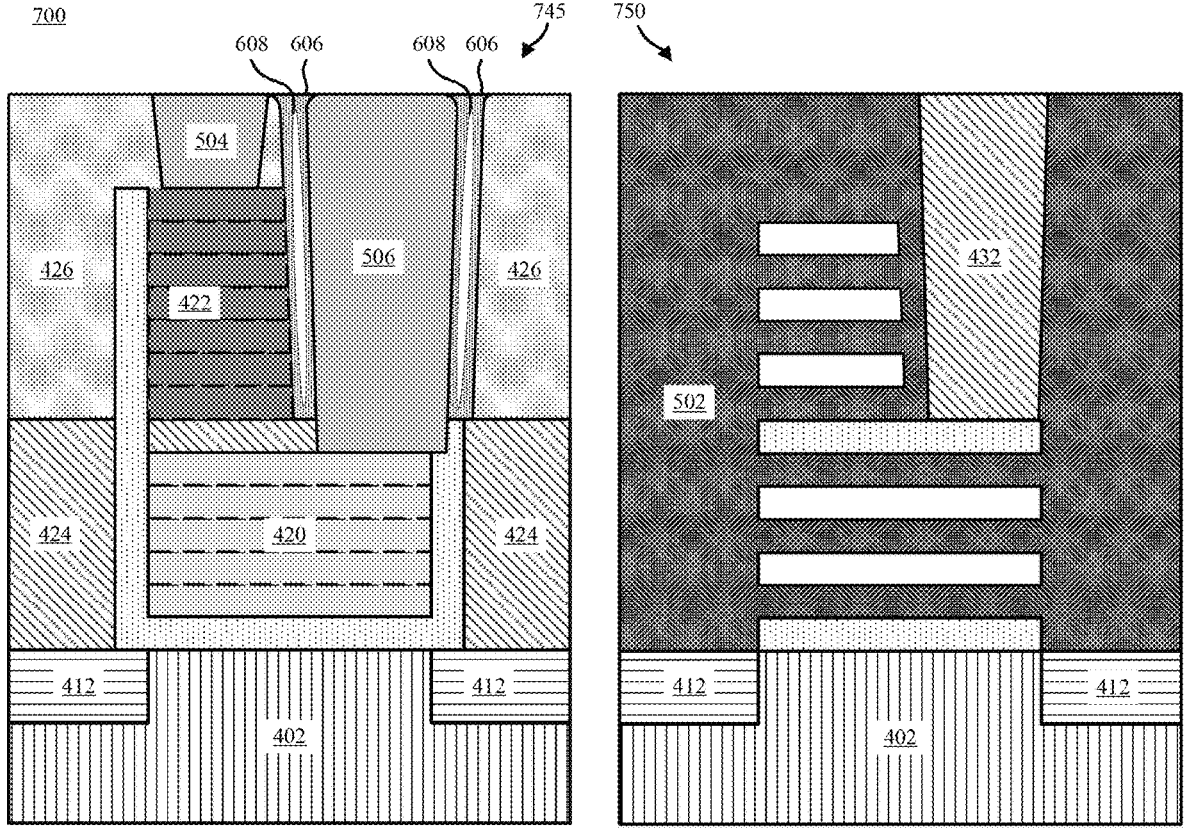
FIG. 7 illustrates a cross sectional view of an example semiconductor structure, in accordance with embodiments of the present disclosure.

In a fifth embodiment of the present disclosure, the stacked FET device comprises a dielectric filled trench over the bottom device next to the top channels and the top source/drain epitaxy. The dielectric filled trench has a first dielectric liner along the sidewalls and a second dielectric fill as the core in the source/drain region. The dielectric filled trench only has second dielectric fill as the core in the gate region. In other words, there is no first dielectric liner in the gate region of the stacked FET device. This is similar to the structure discussed above in the third embodiment. However, unlike the third embodiment, an airgap exists in the first dielectric liner in the source/drain region. A bottom source/drain contact can be formed by selectively etching the second dielectric core to the first dielectric liner through the dielectric filled trench. An electrically conductive material can then be deposited into the core such that the resulting semiconductor device includes the first dielectric liner between the bottom contact and the top RX in the source/drain region. This process is self-aligning and results in a stacked FET device with consistent spacing between the bottom contact and the top RX. FIG. 7 illustrates a completed stacked FET in accordance with the fifth embodiment.

It is to be understood that as used herein, "an embodiment" means one or more embodiments that share a common aspect. For example, "a first embodiment" may include one or more embodiments that are related in that they all share a first common aspect, function, and/or feature. Likewise, "a second embodiment" may include one or more embodiments that are related in that they all share a second common aspect, function, and/or feature. Furthermore, a particular embodiment that has both the first common aspect, function, and/or feature and the second common aspect, function, and/or feature may be considered to be both a first embodiment and a second embodiment.

Figure 3:
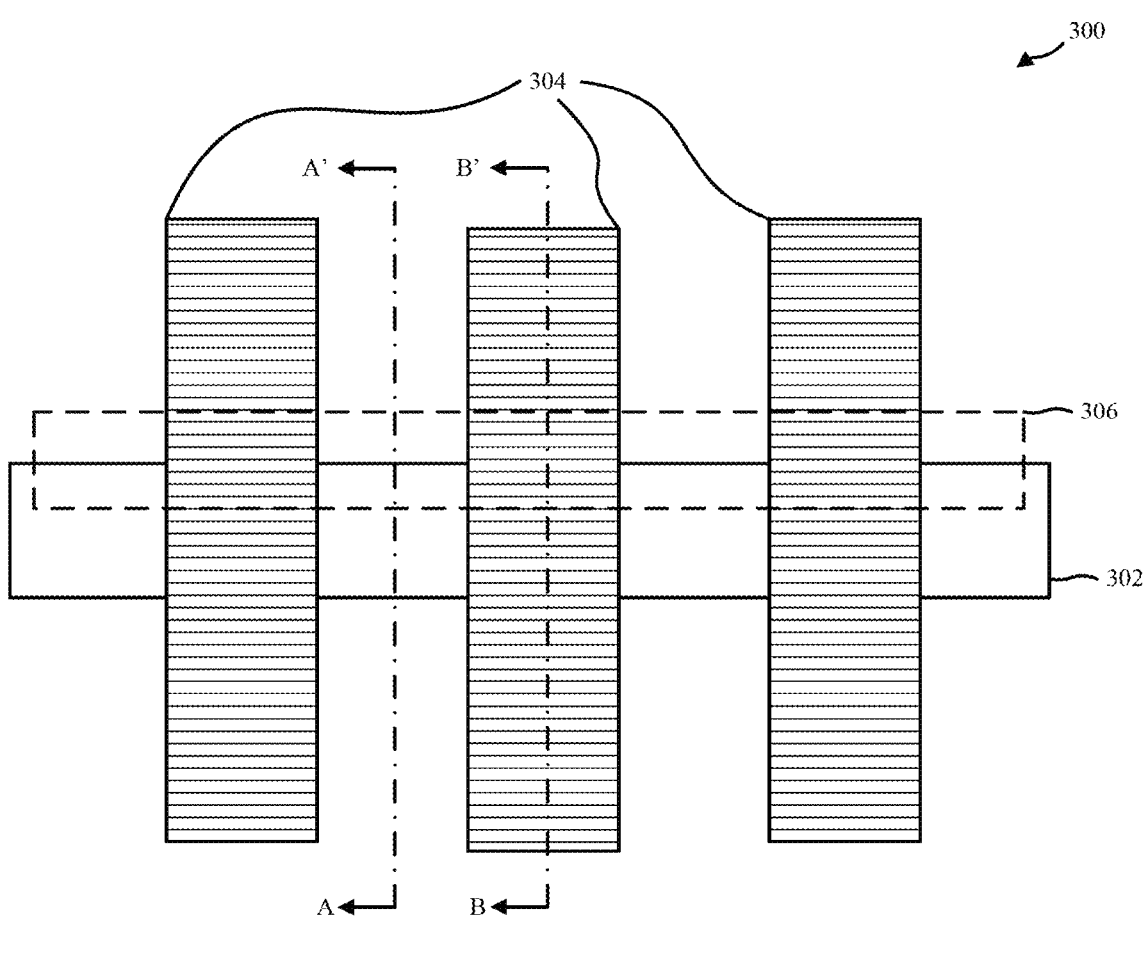
FIG. 3 depicts a plan view of an example semiconductor structure indicating an A-A' cross-section location and a B-B' cross section location for each of the following figures, in accordance with embodiments of the present disclosure.

Turning now to the figures, FIG. 1B is a schematic diagram illustrating an example stacked FET with a trapezoidal top active region, in accordance with a first embodiments of the present disclosure. FIG. 2 illustrates a flowchart of an example method 200 for forming a semiconductor structure, in accordance with embodiments of the present disclosure. FIG. 3 illustrates a plan view of the semiconductor structure after performance of the method 200 as well as the location of the A-A' and B-B' cross sections. FIGS. 4A-4H illustrate the semiconductor structure at various intermediate stages in the fabrication process, in accordance with a second embodiment of the present disclosure. FIGS. 5A-5D illustrate the semiconductor structure at various intermediate stages in the fabrication process, in accordance with a third embodiment of the present disclosure. FIGS. 6A-6B illustrate the semiconductor structure at various intermediate stages in the fabrication process, in accordance with a fourth embodiment of the present disclosure. FIG. 7 illustrates the semiconductor structure after fabrication, in accordance with a fifth embodiment of the present disclosure. In FIGS. 4A-7, the A-A' cross sectional views are shown on the left, and the B-B' cross sectional views are shown on the right.

Referring first to FIG. 1B, shown is a schematic diagram illustrating an example stacked FET 150 with a trapezoidal top active region 154, in accordance with a first embodiments of the present disclosure. The stacked FET 150 includes a top contact 158 disposed on top of the top active region 152. The stacked FET 150 further includes a bottom contact 156 on top of a bottom active region 152.

Unlike the stacked FET 100 shown in FIG. 1A, the stacked FET 150 of FIG. 1B has a trapezoidal top active region 154 (also referred to herein as top source/drain epitaxy). The top active region 154 has a first surface 155 (also referred to herein as an inner surface since it faces the center of the stacked FET 150) that slopes away from the inner surface 157 of the bottom contact 156. The slope of the first surface 155 may be substantially similar to the slope of the inner surface 157 of the bottom contact 156 such that the inner surfaces 155, 157 may be substantially parallel. As a result of the inner surfaces 155, 157 being substantially parallel, a distance S1 from the top of the top active region 154 to the bottom contact 156 is substantially the same as the distance S2 from the bottom of the top active region 154 to the bottom contact 156. This allows the bottom contact 156 to be places as close to the top active region 154 as possible without the natural slope of the bottom contact 156 causing it to short with the top active region 154. Additionally, the use of a sloped top active region 154 allows for a smaller distance between the top active region 154 and the bottom contact without the creation of a large parasitic capacitance.

While the first embodiment depicted in FIG. 1B addresses numerous issues faced by current stacked FET structures, the process for fabricating semiconductor structures according to the first embodiment is not self-aligning. Furthermore, the width of the gap at the top is determined by the lithography process used and is not easily controlled. Accordingly, additional embodiments are discussed below that further enable a self-aligning contact fabrication with higher gap control.

Referring now to FIG. 3, shown is a plan view of an example semiconductor structure 300 following performance of the method 200, which is discussed below, in accordance with embodiments of the present disclosure. The semiconductor structure 300 includes a plurality of gate regions 304 that cross an active region 302. Between the gate regions 304 are source/drain epitaxy regions, as discussed herein. Additionally, as discussed herein, embodiments of the present disclosure include cutting a trench into the structure 300, which will be used to fabricate the bottom contact. The dashed rectangle shows the approximate location of such a trench 306, in some embodiments.

FIG. 3 further shows lines indicating the A-A' cross-section location and the B-B' cross section location for each of the following figures. In the following figures, the A-A' cross section shows the source/drain epitaxy regions during fabrication of the semiconductor structure 300, whereas the B-B' cross section shows the gate regions during fabrication of the semiconductor structure 300. Furthermore, the A-A' cross section diagrams are shown on the left and the B-B' cross section diagrams are shown on the right in subsequent figures.

Referring now to FIG. 2, and with reference to FIGS. 4A-7, shown is a flowchart of an example method 200 for forming a semiconductor structure with a self-aligning bottom contact, in accordance with embodiments of the present disclosure. The method 200 may be performed by, for example, hardware, software, firmware, or any combination thereof. For example, the method 200 may be performed by computer systems of a semiconductor fabrication plant controlling fabrication equipment.

Figure 4A:
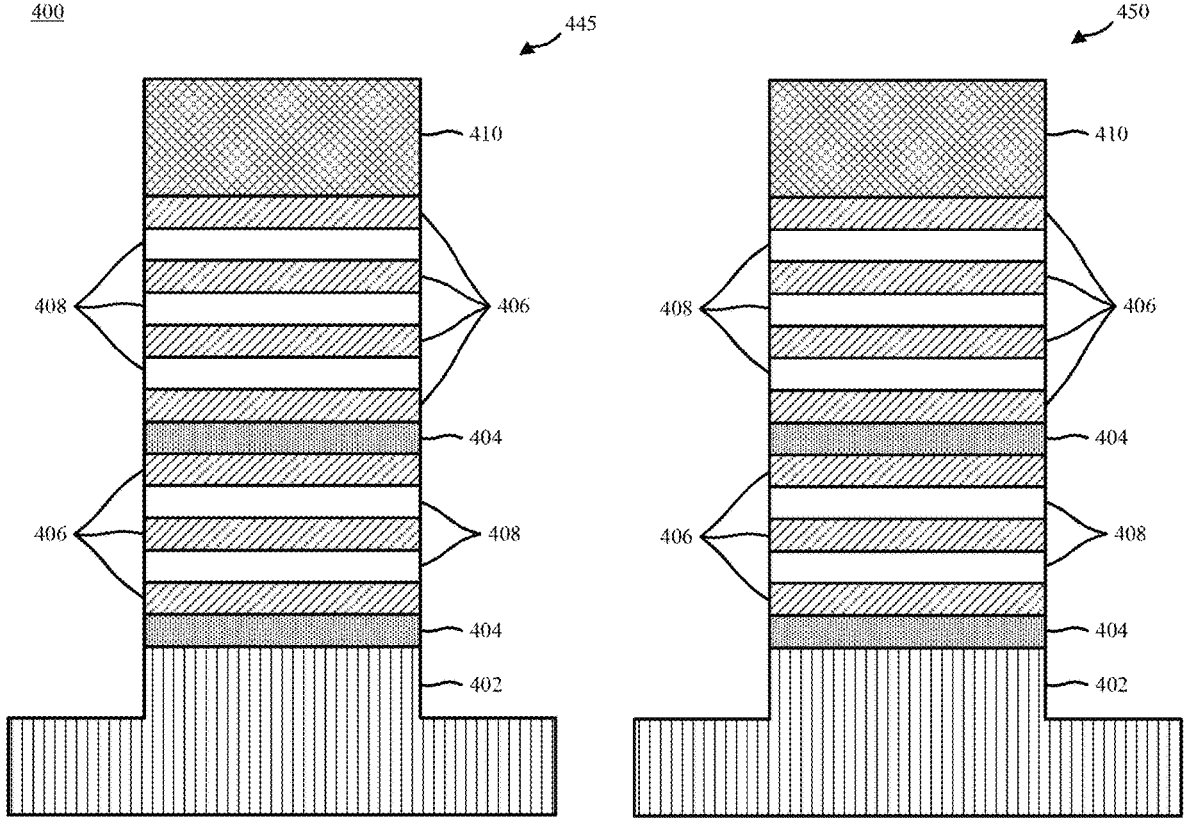
FIG. 4A illustrates a cross-sectional view of an example semiconductor component following the performance of a portion of the example method of FIG. 2, in accordance with embodiments of the present disclosure.

The method 200 begins at operation 202, wherein an active region (RX) cut is formed for a top device with a cavity. In some embodiments, operation 202 includes multiple suboperations, as depicted in FIGS. 4A-4D. First, a stacked FET RX region may be patterned for a stacked FET 400. This is shown in FIG. 4A. In particular, a Si substrate 402 may have a layer of a first sacrificial material 404 deposited thereon. The layer of first sacrificial material 404 may be a sacrificial high-Ge % SiGe layer such as, for example, SiGe55%.

Alternating layers of a second sacrificial material 406 and a semiconductor (e.g., Si) 408 may then be stacked on top of the layer of first sacrificial material 404. The layers of the second sacrificial material 406 may be a sacrificial low-Ge % SiGe such as, for example, SiGe30%. An additional layer of the first sacrificial material 404 is deposited in roughly the middle of the stack, as shown in FIG. 4A. This layer of the first sacrificial material 404 marks the separation between the top active region and the bottom active region in the final stacked FET 400.

After creating the nanosheet stack, a hardmask 410 may be deposited on a portion of the stack, and the stack may be patterned as shown in FIG. 4A. As shown in FIG. 4A, at this stage, there is little to no difference between the source/drain epitaxy region 445 and the gate region 450 of the stacked FET 400.

Figure 4B:
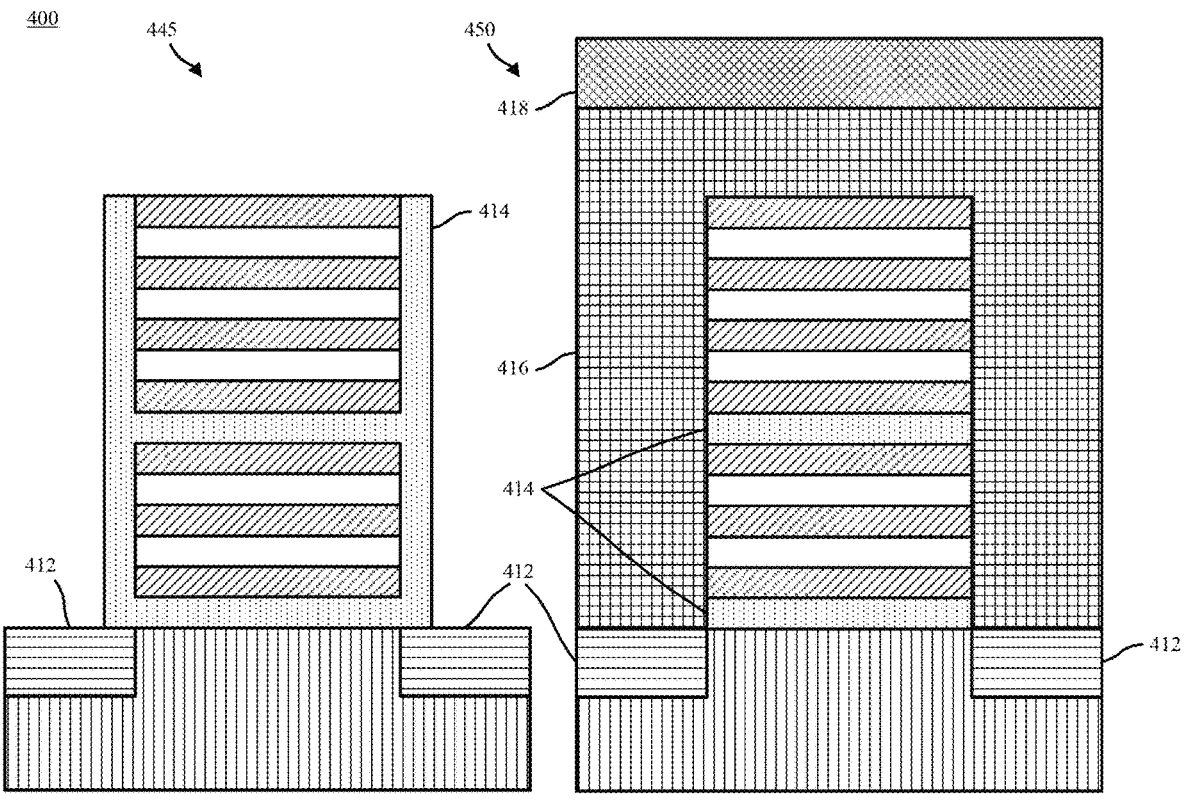
FIG. 4B illustrates a cross sectional view of an example of the semiconductor structure of FIG. 4A following the performance of additional fabrication operations, in accordance with embodiments of the present disclosure.

Referring now to FIG. 4B, a shallow trench isolation (STI) layer 412 is formed on portions of the substrate 402 that are lateral to the patterned stack. This is done in both the source/drain epitaxy region 445 and the gate region 450 of the stacked FET 400. The STI 412 may prevent electric current leakage between the stacked FET 400 and adjacent semiconductor devices. In some embodiments, the STI 412 may be an oxide.

The dummy gate 416 and gate hardmask 418 are deposited followed by a patterning process to define the gate region. The dummy gates 416 may be made of any suitable material as would be recognized by a person of ordinary skill in the art. In some embodiments, the dummy gates 416 are a thin layer of SiO2 plus bulk amorphous silicon (a-Si). Additionally, the first sacrificial material 404 is removed and replaced with one or more spacer layers 414. The one or more spacer layers 414 may include a bottom dielectric isolation (BDI) layer between the substrate 402 and the bottom layer of the second sacrificial material 406 and a middle isolation layer, as shown. Furthermore, the spacer layer 414 may be deposited on the sidewalls of the stack in the source/drain epitaxy region 445. The spacer layer 414 may be made out of, for example, SiO2, SiOCN, SiOC, SiBCN. The spacer layer 414 may be deposited on the substrate 402 after removal of the high-Ge % SiGe layer 404. In some embodiments, a spacer RIE operation may be performed to remove the spacer layer 414 from on top of the STIs 412 and the FET stack. The spacer also serves as gate spacer (not shown).

Figure 4C:
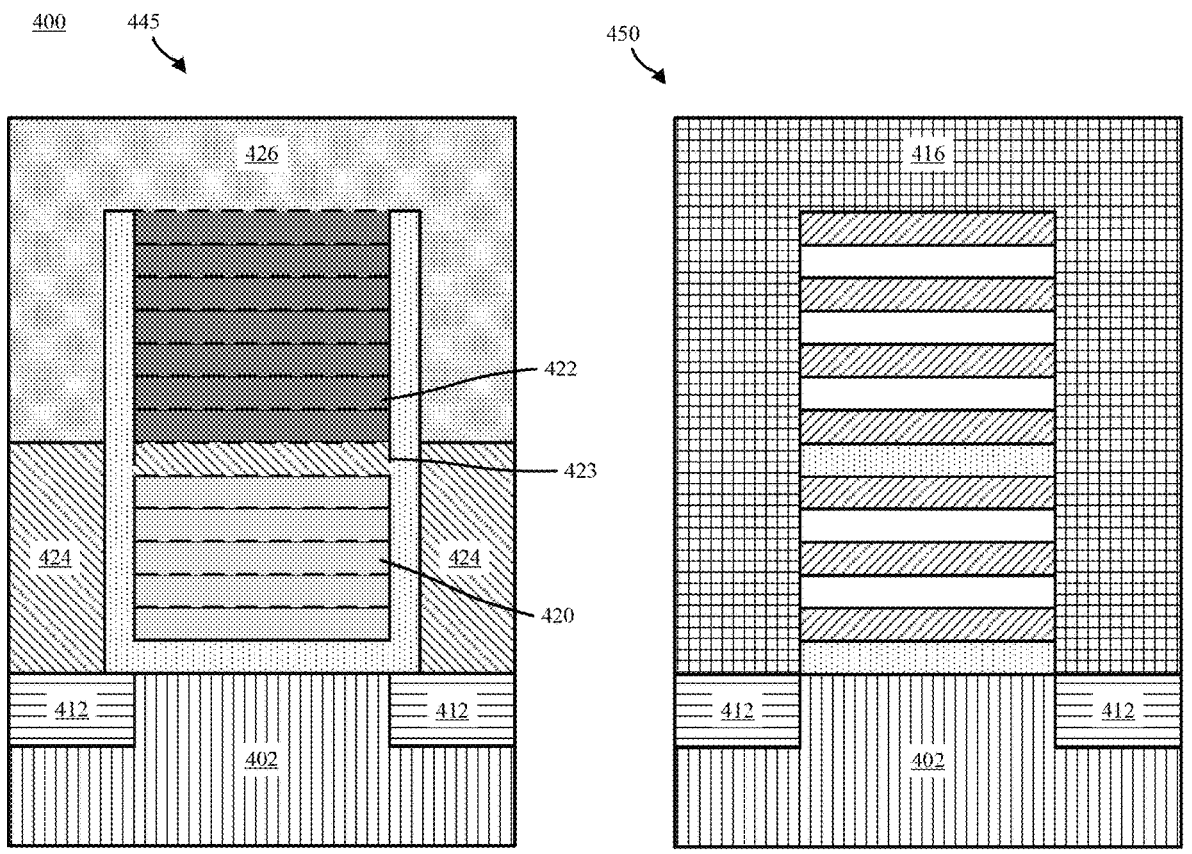
FIG. 4C illustrates a cross sectional view of an example of the semiconductor structure of FIG. 4B following the performance of additional fabrication operations, in accordance with embodiments of the present disclosure.

As shown in FIG. 4C, after forming the agate spacer together with BDI/MDI 414 (shown in FIG. 4B), the nanosheets in the source/drain region is recessed, followed by indenting the sacrificial SiGe layer 406 and formation of inner spacer (not shown). After that, the source/drain epitaxy may be formed in the source/drain epitaxy region 445. In particular, a bottom source/drain epitaxy 420 and a top source/drain epitaxy 422 may be formed. The top and bottom source/drain epitaxies 420, 422 may have different types. For example, one of the source/drain epitaxy 420, 422 may be an nFET source/drain epitaxy, and the other source/drain epitaxy 420, 422 may be a pFET source/drain epitaxy, or both are nFET source/drain epitaxy or both are pFET source/drain epitaxy. The nFET and pFET source/drain epitaxy materials 420, 422 may be grown in a sequential operation (i.e., one after the other), and the bottom ILD 424 is deposited after bottom epitaxy 420 growth to cover it from shorting to top epitaxy 422, as shown in FIG. 4C.

A dielectric liner 423, also referred to herein as the dielectric layer 423, is formed between the bottom source/drain epitaxy 420 and the top source/drain epitaxy 422. In some embodiments, the dielectric liner 423 may be formed out of an interlayer dielectric (ILD), which may also be deposited around the bottom source/drain epitaxy 420 and the spacer layer 414 to create a first ILD layer 424, as shown. In some embodiments, forming the top and bottom source/drain epitaxies 420, 422 and the first ILD 424 may include growing a first type epitaxy between the nanosheets to form the bottom source/drain epitaxy 420, depositing a dielectric (e.g., the first ILD 424) over the bottom source/drain epitaxy 420, recessing the first ILD 424, and then growing a second type epitaxy over the liner 423 to create the top source/drain epitaxy 422. A second ILD 426 may then be deposited on top of and around the top source/drain epitaxy 422. A CMP process, such as polysilicon open CMP (POC), may then be performed to planarize the top of the second ILD 426 to expose the dummy gates 416.

The dielectric liner 423, first ILD 424, and second ILD 426 can include any materials known in the art, such as, for example, porous silicates, carbon doped oxides, silicon dioxides, silicon nitrides, silicon oxynitrides, or other dielectric materials. The dielectric liner 423, first ILD 424, and second ILD 426 can be formed using any method known in the art, such as, for example, chemical vapor deposition, plasma enhanced chemical vapor deposition, atomic layer deposition, or physical vapor deposition. In some embodiments, the dielectric layer 423 and the first ILD 424 are formed of the same material during the same deposition process. In some embodiments, the first ILD 424 and the second ILD 426 are the same material, while in other embodiments they are a different material.

Figure 4D:
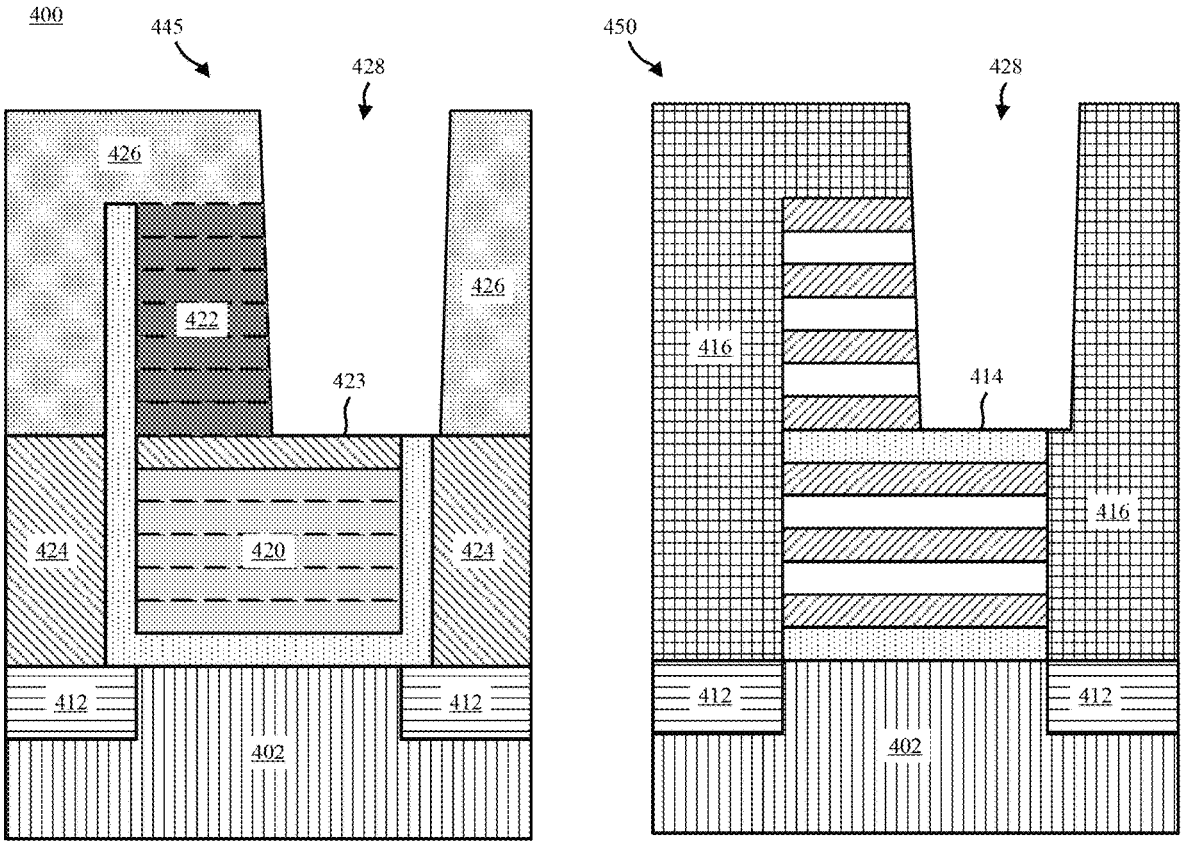
FIG. 4D illustrates a cross sectional view of an example of the semiconductor structure of FIG. 4C following the performance of additional fabrication operations, in accordance with embodiments of the present disclosure.

Next, a top channel and source/drain epitaxy cut process may be performed to cut a trench 428 into the structure 400. This is shown in FIG. 4D. The cut may use a non-selective RIE process that is capable of removing portions of the second ILD 426 and the top source/drain epitaxy 422 in the source/drain epitaxy region 445, as well as the dummy gate 416, the second sacrificial material 406 and the semiconductor (e.g., Si) 408 in the gate region 450. As illustrated in FIG. 4D, the trench 428 may be cut to a depth that exposes a top portion of the dielectric layer 423 in the source/drain epitaxy region 445 and the top of the one or more MDI layers 414 in the gate region 450. Furthermore, as shown in FIG. 4D, the trench 428 may have sloped sidewalls.

Figure 4E:
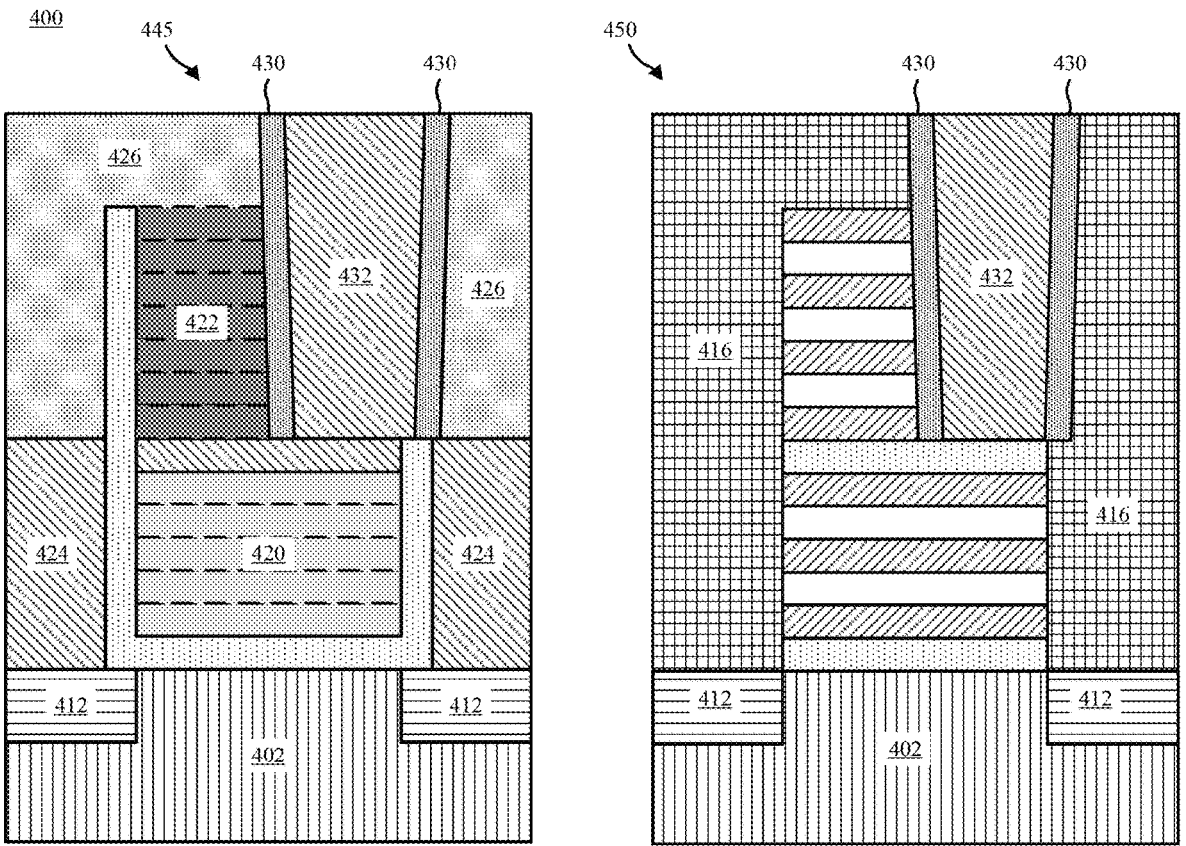
FIG. 4E illustrates a cross sectional view of an example of the semiconductor structure of FIG. 4D following the performance of additional fabrication operations, in accordance with embodiments of the present disclosure.

As shown in FIG. 4E, after cutting the trench 428, a first dielectric spacer 430 may be formed along the sidewalls of the trench 428 (shown in FIG. 4D). The first dielectric spacer 430 may be made of, for example, SiOC, SiN, or SiC. A second dielectric fill 432 may then be deposited to fill in the remaining portion of the trench between the first dielectric spacer 430. One or more CMP processes may be used to planarize the structure 400 such that the tops of the second ILD 426, the first dielectric spacer 430, the second dielectric fill 432, and the dummy gates 416 are exposed.

Figure 4F:
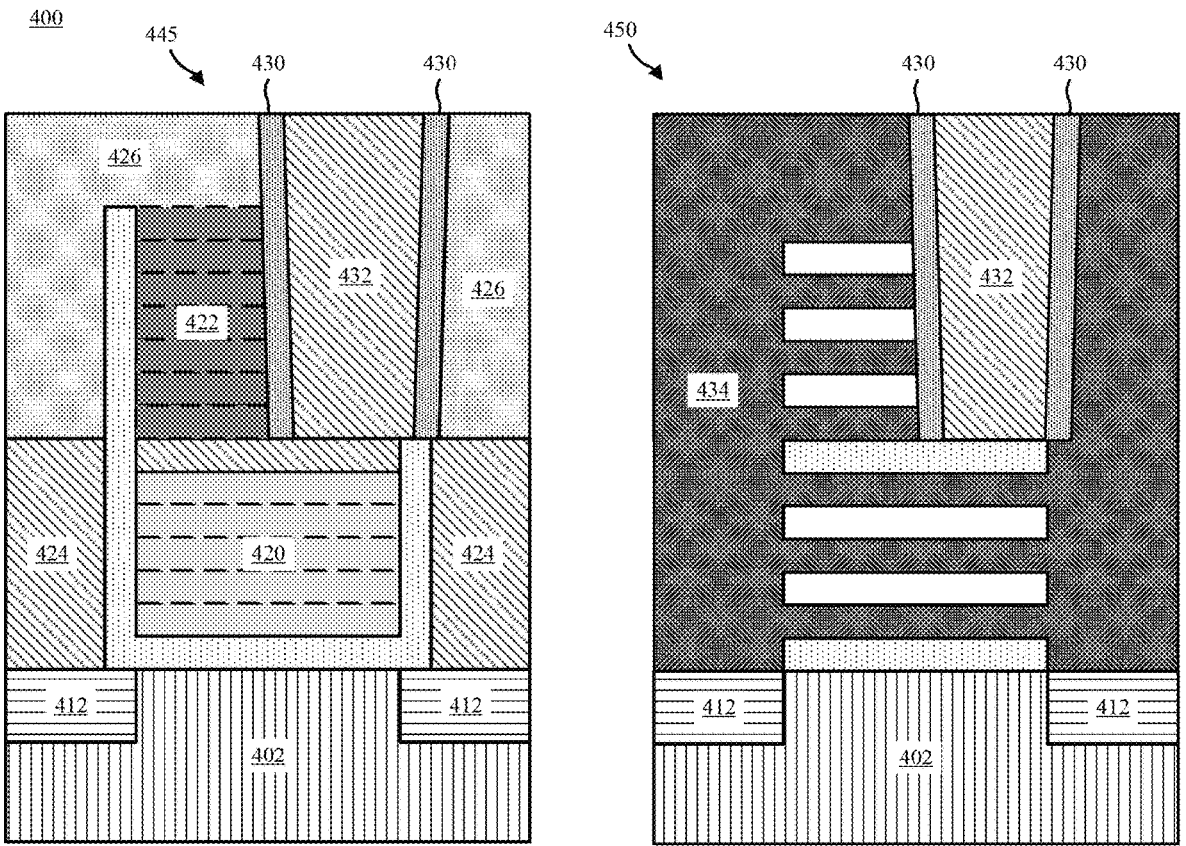
FIG. 4F illustrates a cross sectional view of an example of the semiconductor structure of FIG. 4E following the performance of additional fabrication operations, in accordance with embodiments of the present disclosure.

Next, the dummy gates 416 are removed, the remaining second sacrificial material 406 layers in the gate region 450 are removed, and the high-k dielectric and metal gate layer 434 is formed on top of and around the remaining semiconductor material 408 in the gate region 450, as shown in FIG. 4F. In other words, during this stage, a replacement high-k metal gate (HKMG) is formed in place of each dummy gate 416 and SiGe layer 406. The high-k metal gate layer 434 can be any suitable gate dielectric materials, such as HfO2, ZrO2, HfSiOx, HfLaOx, HfAlOx, etc, followed by work-function metals, such as TiN, TiC, TiAl, TiAlC, etc, followed by optional low resistance conducting metals such as W, Co and Ru.

Those skilled in the art will recognize that a "replacement metal gate" refers to a gate, which replaces a previously formed dummy gate (also referred to herein as a sacrificial gate, a non-active gate, or a non-gate) and becomes an active component of the semiconductor structure being formed. The work function metal can comprise a metal selected so as to have a specific work function appropriate for a given type FET (e.g., an N-type FET or a P-type FET). For example, for a silicon-based N-type FET, the work function metal can comprise hafnium, zirconium, titanium, tantalum, aluminum, or alloys thereof, such as hafnium carbide, zirconium carbide, titanium carbide, tantalum carbide, or aluminum carbide, so that the work function metal has a work function similar to that of N-doped polysilicon. For a silicon-based P-type FET, the work function metal can comprise, for example, ruthenium, palladium, platinum, cobalt, or nickel, or a metal oxide (e.g., aluminum carbon oxide or aluminum titanium carbon oxide) or a metal nitride (e.g., titanium nitride, titanium silicon nitride, tantalum silicon nitride, titanium aluminum nitride, or tantalum aluminum nitride) so that the work function metal has a work function similar to that of P-doped polysilicon.

Figure 4G:
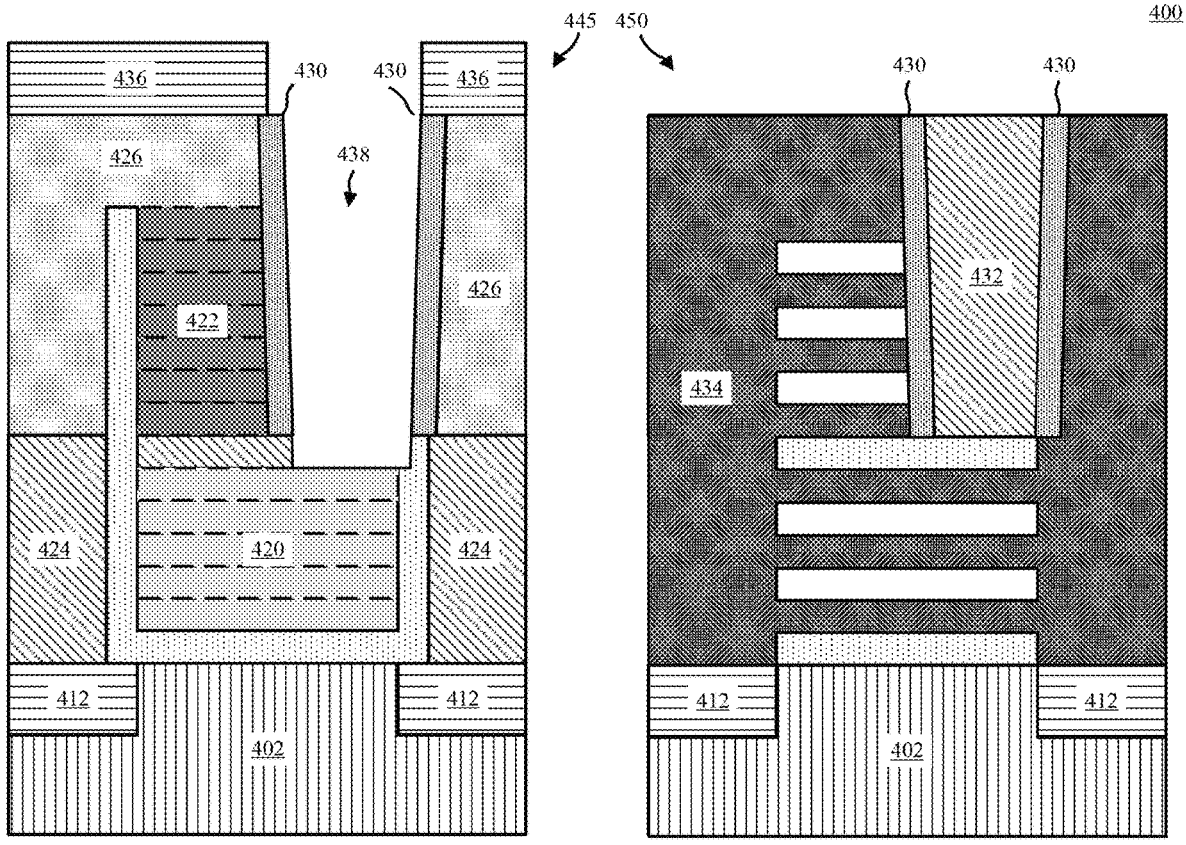
FIG. 4G illustrates a cross sectional view of an example of the semiconductor structure of FIG. 4F following the performance of additional fabrication operations, in accordance with embodiments of the present disclosure.

As shown in FIG. 4G, the self-aligned bottom contact trench 438 may then be formed. As used herein, "self-aligned" means that the bottom contact will be formed such that it has substantially uniform distance from the top epitaxy from the top to the bottom. The self-aligned bottom contact trench 438 may be formed by selectively patterning the second dielectric fill 432 in the source/epitaxy region 445. Additionally, an organic planarization layer (OPL) 436 may be deposited on top of the second ILD 426.

The OPL 436 can be deposited using, e.g., a spin-on coating process. The OPL 436 can be a self-planarizing organic material that includes carbon, hydrogen, oxygen, and optionally nitrogen, fluorine, and silicon. In one embodiment, the self-planarizing organic material can be a polymer with sufficiently low viscosity so that the top surface of the applied polymer forms a planar horizontal surface. In one embodiment, the OPL 436 can include a transparent organic polymer. The OPL can be a standard CxHy polymer. Non-limiting examples of OPL materials include, but are not limited to, CHM701B, commercially available from Cheil Chemical Co., Ltd.®, HM8006 and HM8014, commercially available from JSR Corporation®, and ODL-102 or ODL-401, commercially available from ShinEtsu Chemical, Co., Ltd®.

Figure 4H:
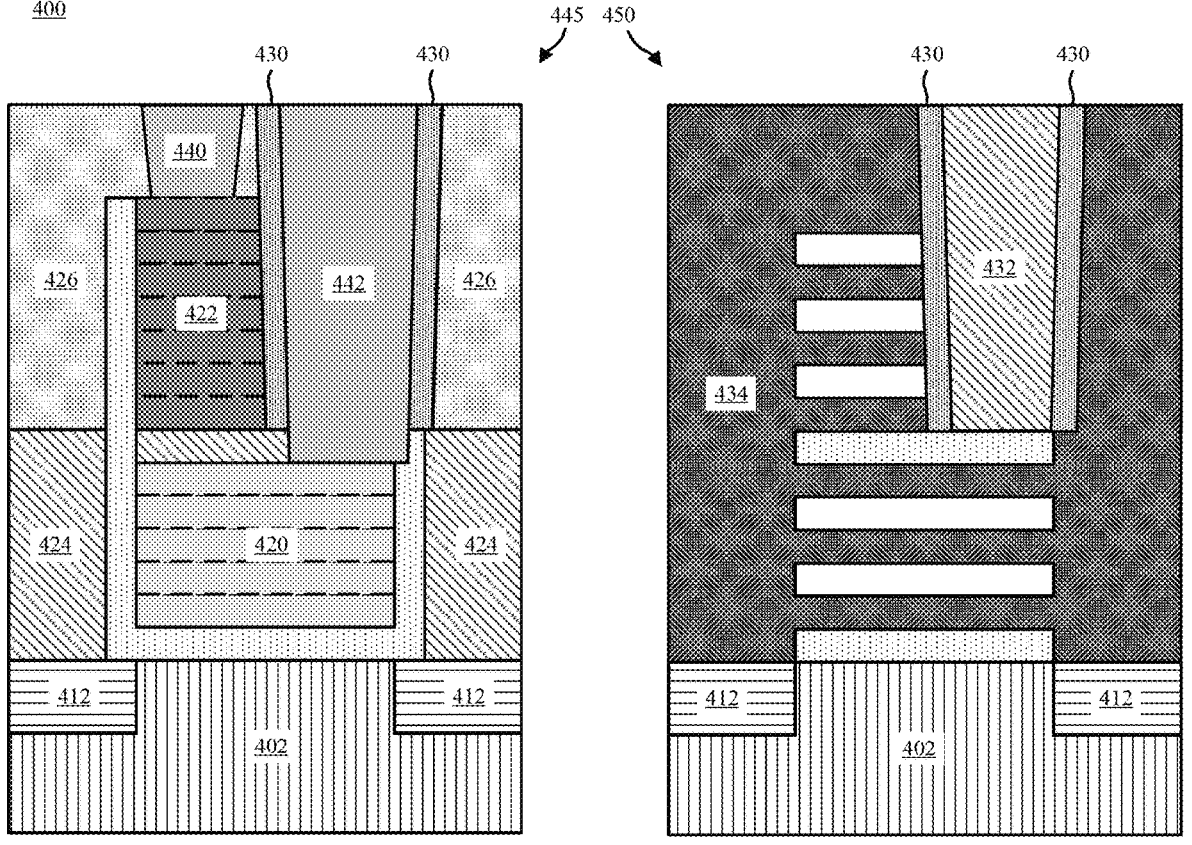
FIG. 4H illustrates a cross sectional view of an example of the semiconductor structure of FIG. 4G following the performance of additional fabrication operations, in accordance with embodiments of the present disclosure.

After forming the self-aligned bottom contact trench 438, a top contact trench may be patterned and metallization may be performed. This is illustrated in FIG. 4H. As shown, the top contact 440 contacts the top of the top source/drain epitaxy 422, whereas the bottom contact 442 contacts the top of the bottom source/drain epitaxy 420. Due to the first dielectric spacer layer 430 between the bottom contact 442 and the top source/drain epitaxy 422, the bottom contact is self-aligned and won't short to the top of the top source/drain epitaxy 422.

Referring now to FIGS. 5A-5D, shown are cross sections views of an example of the semiconductor structure 500 having a source/drain epitaxy region 545 and a gate region 550, in accordance with a third embodiment of the present disclosure. In particular, the third embodiment shown in FIGS. 5A-5D deviates from the second embodiment after forming the first dielectric spacer and the second dielectric fill. However, the processes performed prior to forming the first dielectric spacer and the second dielectric fill shown in FIG. 4A-4D are still performed in the third embodiment. Accordingly, the process illustrated in FIGS. 5A-5D starts from the intermediate semiconductor structure state shown in FIG. 4E.

Figure 5A:
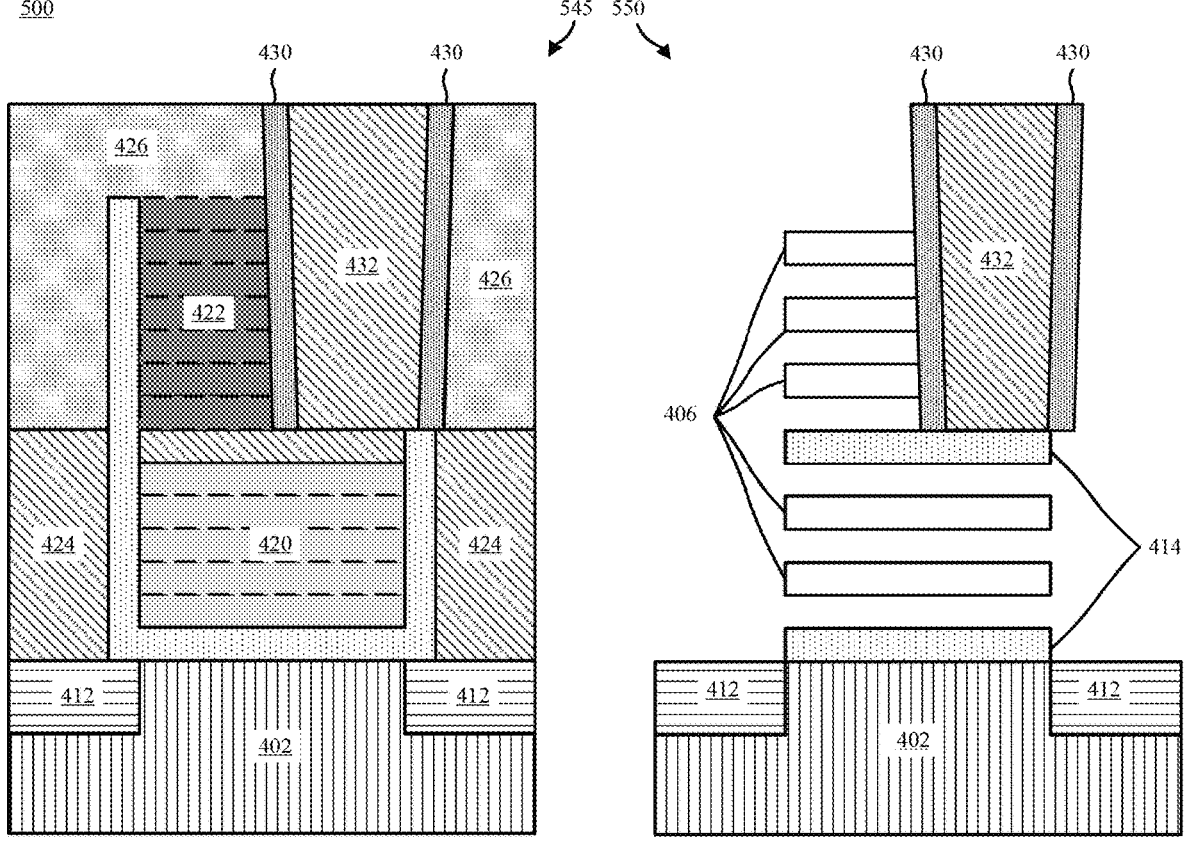
FIG. 5A illustrates a cross sectional view of an example of the semiconductor structure of FIG. 4E following the performance of additional fabrication operations, in accordance with embodiments of the present disclosure.
Figure 5B:
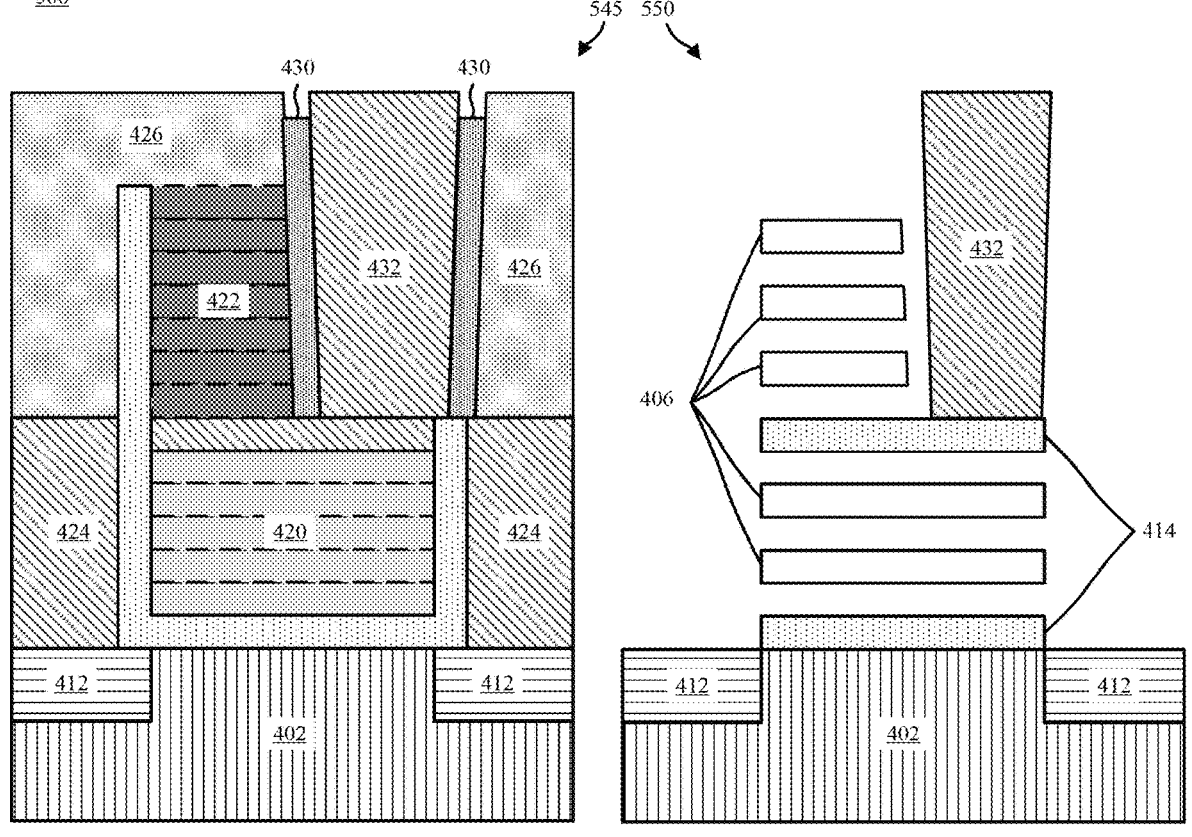
FIG. 5B illustrates a cross sectional view of an example of the semiconductor structure of FIG. 5A following the performance of additional fabrication operations, in accordance with embodiments of the present disclosure.

As shown in FIG. 5A, after forming the first dielectric spacer 430 and the second dielectric fill 432, the dummy gates 416 and the second sacrificial material 406 (both shown in FIG. 4E) are removed. The exposed portion first dielectric liner 430 is then selectively removed. This is shown in FIG. 5B. As shown, the first dielectric liner 430 is completely removed from the gate region 550, while only a portion of it (at the top) is removed from the source/drain epitaxy region 545.

Figure 5C:
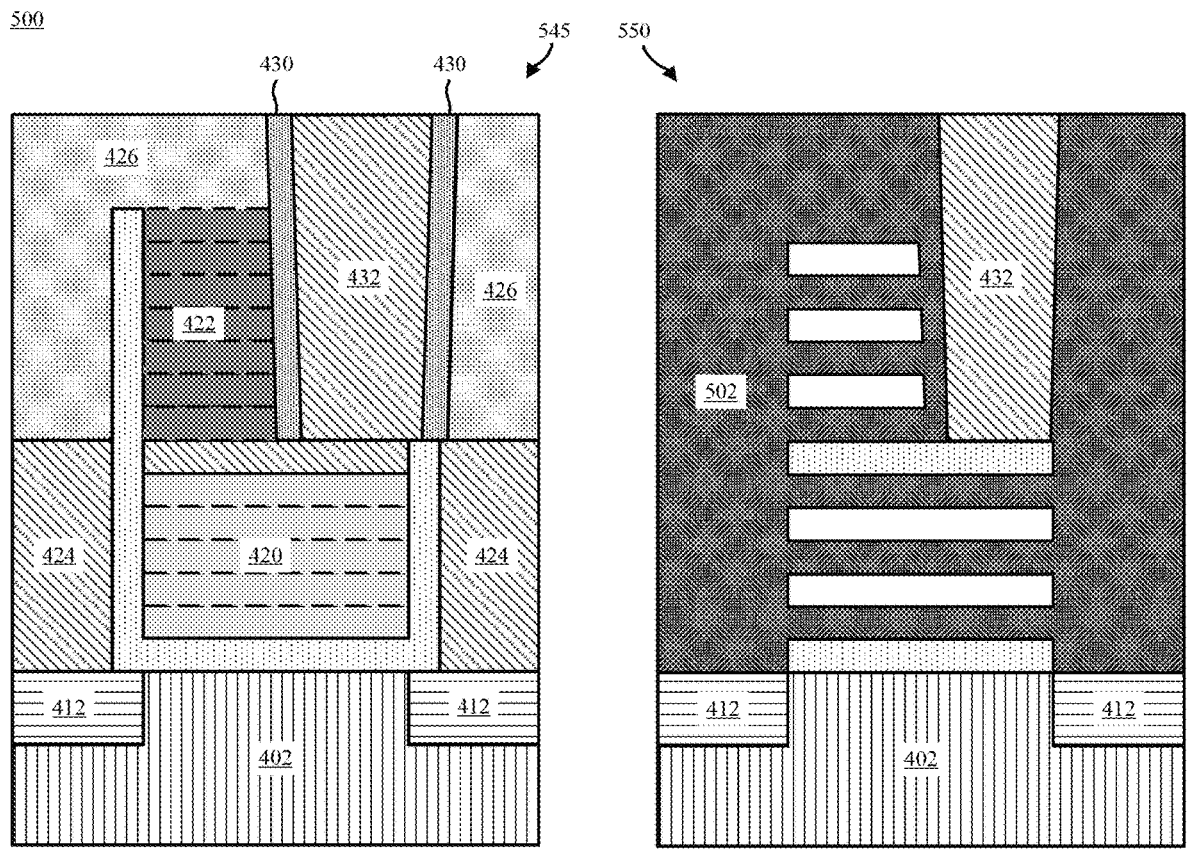
FIG. 5C illustrates a cross sectional view of an example of the semiconductor structure of FIG. 5B following the performance of additional fabrication operations, in accordance with embodiments of the present disclosure.
Figure 5D:
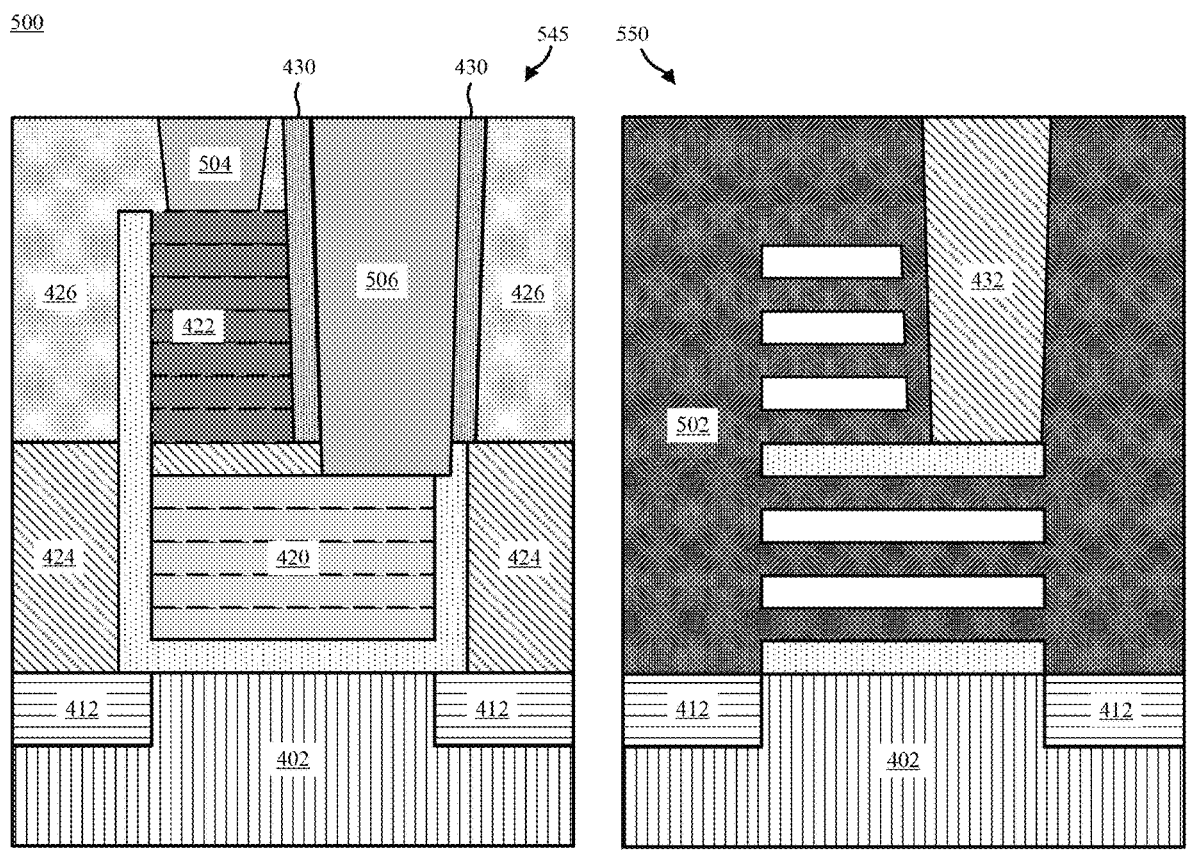
FIG. 5D illustrates a cross sectional view of an example of the semiconductor structure of FIG. 5C following the performance of additional fabrication operations, in accordance with embodiments of the present disclosure.

Next, a high-k metal gate layer 502 is formed on top of and around the remaining semiconductor material 408 in the gate region 450, as shown in FIG. 5C. In other words, during this stage, a replacement metal gate is formed in place of each dummy gate 416 and SiGe layer 406. The high-k metal gate layer 502 can be any suitable material discussed earlier. A CMP process may then be used to planarize the semiconductor structure 500.

After forming high-k metal gate layer 502, a bottom contact trench and top contact trench may be patterned and metallization may be performed. This is illustrated in FIG. 4D. As shown, the top contact 504 contacts the top of the top source/drain epitaxy 422, whereas the bottom contact 506 contacts the top of the bottom source/drain epitaxy 420. Due to the first dielectric spacer layer 430 between the bottom contact 506 and the top source/drain epitaxy 422, the bottom contact 506 is self-aligned and won't short to the top of the top source/drain epitaxy 422.

Additionally, because the first dielectric spacer 430 was removed from the gate region 550, the final structure 500 includes a high-k metal gate (HKMG) layer 502 that completely surround the semiconductor material 408 in the gate region 550, thereby being a gate-all-around structure. This is in contrast to the second embodiment shown in FIG. 4H, which is a tri-gate structure.

Referring now to FIGS. 6A-6B, shown are cross sections views of an example of the semiconductor structure 600 having a source/drain epitaxy region 645 and a gate region 650, in accordance with a fourth embodiment of the present disclosure. In particular, the fourth embodiment shown in FIGS. 6A-6B continues after forming the semiconductor structure 400 of the second embodiment. Accordingly, the process illustrated in FIGS. 6A-6B starts from the intermediate semiconductor structure state shown in FIG. 4H.

As shown in FIG. 6A, after forming the top and bottom contacts 440, 442, the first dielectric spacer 430 is selectively recessed. This creates gaps 602 between the bottom contact 442 and its neighboring structures: the top source/drain epitaxy 422 and the second ILD 426. Additionally, gaps are created between the second dielectric fill 432 in the gate region 650 and its neighboring structures: the metal gate 434 and the semiconductor material 408. This process will also remove a portion of the second ILD 426, the second dielectric fill 432, the metal gate 434, and the metal bottom contact 442. This is particularly apparent at the corners, as illustrated by the rounded corners 604.

After forming the gaps 602, a non-conformal dielectric 606 is deposited into the gaps. This is shown in FIG. 6B. The non-conformal dielectric 606 is deposited such that air gaps 608 are formed as well. These airgaps help reduce the parasitic capacitance between the top source/drain epitaxy 422 and the bottom contact 442.

Referring now to FIG. 7, shown are cross sections views of an example of the semiconductor structure 700 having a source/drain epitaxy region 745 and a gate region 750, in accordance with a fifth embodiment of the present disclosure. In particular, the fifth embodiment shown in FIG. 7 continues after forming the semiconductor structure 500 of the third embodiment. Accordingly, the structure 700 illustrated in FIG. 7 follows the intermediate semiconductor structure state shown in FIG. 5D.

As shown in FIG. 7, after forming the top and bottom contacts 504, 506, the first dielectric spacer 430 is selectively recessed. This creates gaps between the bottom contact 506 and its neighboring structures: the top source/drain epitaxy 422 and the second ILD 426. This process will also remove a portion of the second ILD 426 and the metal bottom contact 506. This is particularly apparent at the corners, as illustrated by the corners of these structures being rounded.

After forming the gaps, a non-conformal dielectric 606 is deposited into the gaps. The non-conformal dielectric 606 is deposited such that air gaps 608 are formed as well. These airgaps help reduce the parasitic capacitance between the top source/drain epitaxy 422 and the bottom contact 506.

It is to be understood that the aforementioned advantages are example advantages and should not be construed as limiting. Embodiments of the present disclosure can contain all, some, or none of the aforementioned advantages while remaining within the spirit and scope of the present disclosure.

Detailed embodiments of the structures of the present invention are described herein. However, it is to be understood that the embodiments described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description It should also be understood that material compounds will be described in terms of listed elements, e.g., SiN, SiCN, SiCO, or SiGe. These compounds include different proportions of the elements within the compound, e.g., SiGe includes $Si_xGe_{(1-x)}$ where x is less than or equal to 1, and the like. In addition, other elements can be included in the compound and still function in accordance with the present principles. The compounds with additional elements will be referred to herein as alloys.

It should be noted that not all masking, patterning, and lithography processes are shown because a person of ordinary skill in the art would recognize where masking and patterning processes are utilized to form the identified layers and openings, and to perform the identified selective etching processes, as described herein.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used, and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

As used herein, "a number of" when used with reference to items, means one or more items. For example, "a number of different types of networks" is one or more different types of networks.

When different reference numbers comprise a common number followed by differing letters (e.g., 100a, 100b, 100c) or punctuation followed by differing numbers (e.g., 100-1, 100-2, or 100.1, 100.2), use of the reference character only without the letter or following numbers (e.g., 100) may refer to the group of elements as a whole, any subset of the group, or an example specimen of the group.

Further, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure may not be necessary. The previous detailed description is, therefore, not to be taken in a limiting sense.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present invention has been described in terms of specific embodiments, it is anticipated that alterations and modification thereof will become apparent to the skilled in the art. Therefore, it is intended that the following claims be interpreted as covering all such alterations and modifications as fall within the true spirit and scope of the invention.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A stacked field-effect transistor (FET) comprising:

a top active region, wherein the width of the top of the top active region is smaller than the width of the bottom of the top active region;

a top contact in direct contact with a top surface of the top active region;

a bottom active region located substantially below the top active region; and a bottom contact in direct contact with a top surface of the bottom active region, the bottom contact being wider at a top end than at a bottom end such that a horizontal distance between the bottom contact and the top active region is substantially identical from a bottom surface of the top active region to the top surface of the top active region.

2. The stacked FET of claim 1, wherein the bottom contact extends vertically from the top surface of the bottom active region and lateral to the top active region.

3. The stacked FET of claim 1, wherein the top and bottom active regions are nanosheet transistor regions having the same doping type.

4. The stacked FET of claim 1, wherein the top and bottom active regions are nanosheet transistor regions having different doping types.

5. The stacked FET of claim 1, wherein the top active region has a substantially trapezoidal shape.

6. A stacked field-effect transistor (FET) comprising:

a top device comprising a top epi region that is stacked over a bottom device that comprises a bottom epi region;

a trapezoidal bottom contact in direct contact with the bottom epi region, the trapezoidal bottom contact comprising a sloped sidewall resulting from being wider at a top end than at a bottom end; and a dielectric liner in direct contact with the sloped sidewall of the trapezoidal bottom contact and in direct contact with an entirety of a side surface of the top epi region, wherein the sloped sidewall of the trapezoidal bottom contact is substantially parallel with the side surface of the top epi region.

7. The stacked FET of claim 6, further comprising:

an elongated airgap enclosed within the dielectric liner.

8. The stacked FET of claim 6, further comprising:

a middle isolation layer in direct contact with the bottom epi region, in direct contact with the top epi region, and in direct contact with the dielectric liner.

9. The stacked FET of claim 8, wherein the middle isolation layer is further in direct contact with the trapezoidal bottom contact.

* * * * *